United States Patent
Chino et al.

(10) Patent No.: US 12,198,937 B2
(45) Date of Patent: Jan. 14, 2025

(54) ETCHING METHOD AND PLASMA PROCESSING APPARATUS

(71) Applicant: TOKYO ELECTRON LIMITED, Tokyo (JP)

(72) Inventors: Koki Chino, Miyagi (JP); Hikoichiro Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 228 days.

(21) Appl. No.: 17/514,888

(22) Filed: Oct. 29, 2021

(65) Prior Publication Data
US 2022/0139719 A1 May 5, 2022

(30) Foreign Application Priority Data

Oct. 30, 2020 (JP) .................................. 2020-182345
Oct. 4, 2021 (JP) .................................. 2021-163664

(51) Int. Cl.
*H01L 21/311* (2006.01)
*H01J 37/32* (2006.01)
*H01L 21/3065* (2006.01)

(52) U.S. Cl.
CPC .. *H01L 21/31116* (2013.01); *H01J 37/32449* (2013.01); *H01L 21/3065* (2013.01); *H01J 2237/334* (2013.01)

(58) Field of Classification Search
None
See application file for complete search history.

(56) References Cited

U.S. PATENT DOCUMENTS

| 10,763,126 B2 * | 9/2020 | Nagami ............. H01J 37/32165 |
| 2015/0235862 A1 * | 8/2015 | Takahashi ......... H01L 21/32135 438/714 |
| 2019/0074191 A1 * | 3/2019 | Nagatomo ........ H01J 37/32091 |
| 2020/0126804 A1 * | 4/2020 | Dole ................. H01L 21/32133 |

FOREIGN PATENT DOCUMENTS

| JP | H09-050984 A | 2/1997 |
| JP | 2019-192874 A | 10/2019 |
| JP | 2019-192876 A | 10/2019 |

* cited by examiner

*Primary Examiner* — Stephanie P Duclair
(74) *Attorney, Agent, or Firm* — XSENSUS LLP

(57) ABSTRACT

An etching method includes: (a) preparing a substrate including a silicon-containing film including a silicon oxide film and placed on a substrate support provided in a chamber; (b) supplying a processing gas containing a tungsten hexafluoride gas, a gas containing carbon and fluorine, and an oxygen-containing gas into the chamber; and (c) generating plasma from the processing gas to etch the silicon-containing film. (c) includes periodically applying a negative DC voltage to the substrate support.

28 Claims, 11 Drawing Sheets

ETCHING METHOD AND PLASMA PROCESSING APPARATUS

CROSS-REFERENCE TO RELATED APPLICATIONS

This application is based on and claims priority from Japanese Patent Application Nos. 2020-182345 and 2021-163664, filed on Oct. 30, 2020 and Oct. 4, 2021, respectively, with the Japan Patent Office, the disclosure of which is incorporated herein in their entireties by reference.

TECHNICAL FIELD

An embodiment of the present disclosure relates to an etching method and a plasma processing apparatus.

BACKGROUND

Plasma etching is performed to form a recess in a silicon-containing film of a substrate. In the plasma etching, in order to suppress an abnormality in the shape of the recess, a technique has been proposed for etching the silicon-containing film while forming a conductive layer on the surface of the substrate. Japanese Patent Laid-Open Publication No. 09-050984 discloses such technique.

SUMMARY

An embodiment of the present disclosure provides an etching method. The etching method includes step (a) of preparing a substrate including a silicon-containing film that includes a silicon oxide film. The substrate is placed on a substrate support provided in a chamber. The etching method further includes step (b) of supplying a processing gas into the chamber. The processing gas contains tungsten hexafluoride gas, a gas containing carbon and fluorine, and an oxygen-containing gas. The etching method further includes step (c) of generating plasma from the processing gas to etch the silicon-containing film. Step (c) includes periodically applying a negative DC voltage to the substrate support.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
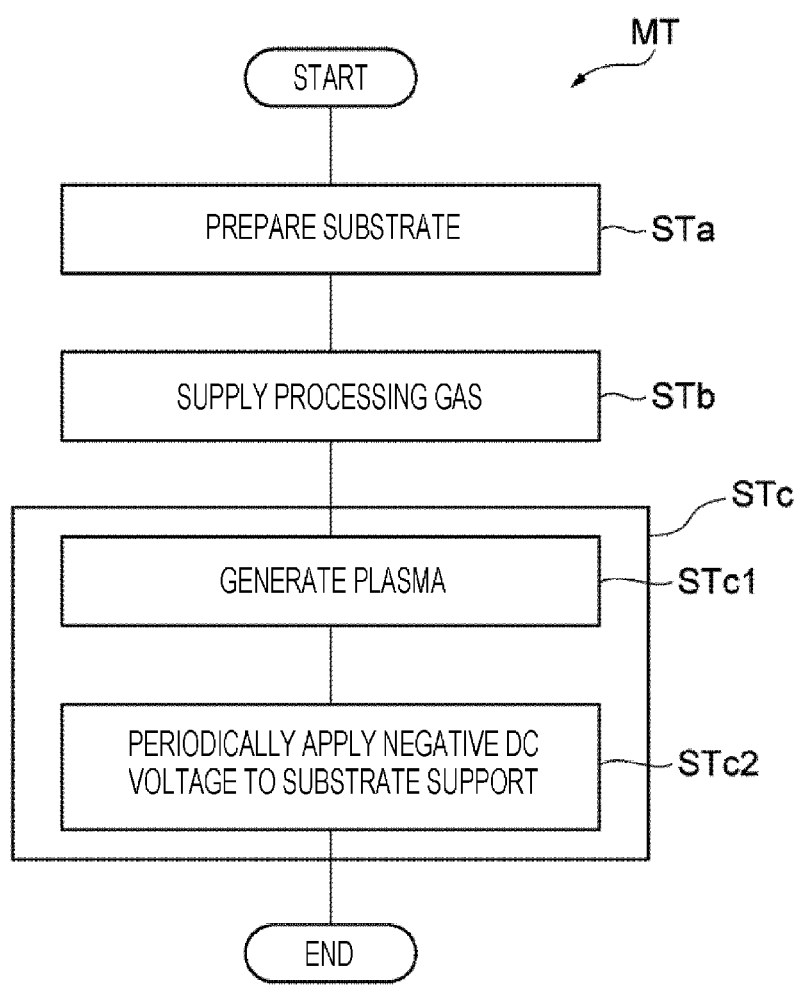
FIG. 1 is a flowchart of an etching method according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

An embodiment of the present disclosure provides an etching method. The etching method includes step (a) of preparing a substrate including a silicon-containing film including a silicon oxide film. The substrate is placed on a substrate support provided in a chamber. The etching method further includes step (b) of supplying a processing gas into the chamber. The processing gas contains tungsten hexafluoride gas, a gas containing carbon and fluorine, and an oxygen-containing gas. The etching method further includes step (c) of generating plasma from the processing gas to etch the silicon-containing film. Step (c) includes periodically applying a negative DC voltage to the substrate support.

In the embodiment, step (c) may include substituting a part of silicon atoms in the silicon-containing film with tungsten atoms on a bottom surface of a recess formed in the silicon-containing film by etching. Step (c) may further include etching the silicon-containing film in which a part of silicon atoms are substituted with tungsten atoms.

In the embodiment, step (c) may include applying a negative DC voltage to an upper electrode provided above the substrate support when the negative DC voltage is not applied to the substrate support. In the embodiment, it is possible to supply a relatively large amount of secondary electrons released from the upper electrode to the substrate when the negative DC voltage is not applied to the substrate support. Therefore, it is possible to neutralize the charge at the bottom of the recess.

In the embodiment, in step (c), when the negative DC voltage is applied to the substrate support, the negative DC voltage may not be applied to the upper electrode. Alternatively, the negative DC voltage having an absolute value smaller than an absolute value of the negative DC voltage applied to the upper electrode when the negative DC voltage is not applied to the substrate support may be applied to the upper electrode when the negative DC voltage is applied to the substrate support.

In the embodiment, the pressure in the chamber in step (c) may be set to less than 1.333 Pa.

In the embodiment, a ratio of a flow rate of the tungsten hexafluoride gas in the processing gas to a flow rate of the processing gas may be 5% by volume or less.

In the embodiment, the processing gas may further contain nitrogen trifluoride gas.

In the embodiment, a ratio of a flow rate of the nitrogen trifluoride gas in the processing gas to a flow rate of the processing gas may be larger than a flow rate of the tungsten hexafluoride gas in the processing gas.

In the embodiment, the silicon-containing film may include a silicon oxide film. The processing gas may contain a fluorocarbon gas as the gas containing carbon and fluorine. The silicon-containing film may further include a silicon nitride film. In step (c), a tungsten-containing film may be formed on a side wall formed on the silicon nitride film by etching. The silicon-containing film may further include a polycrystalline silicon film.

In the embodiment, the silicon-containing film may include a silicon nitride film. The processing gas may contain a hydrofluorocarbon gas as the gas containing carbon and fluorine.

In the embodiment, the silicon-containing film may include a stacked film including a silicon oxide film and a silicon nitride film. Step (c) may include etching the silicon nitride film in a state where a bias frequency is set to a first frequency, the bias frequency being a reciprocal of the time interval in which the negative DC voltage is applied to the substrate support. Step (c) may include etching the silicon oxide film in a state where the bias frequency is set to a second frequency larger than the first frequency.

In the embodiment, the substrate may further include an underlying region or an etching stop layer. The etching method may further include stopping the supply of the tungsten hexafluoride gas in the processing gas during a period including a time when the underlying region or the etching stop layer is exposed. The etching method may further include etching the silicon-containing film with plasma generated from a gas other than the tungsten hexafluoride gas contained in the processing gas.

An etching method according to another embodiment includes step (a) of preparing a substrate including a silicon-containing film including a silicon oxide film. The substrate is placed on a substrate support provided in a chamber. The etching method further includes step (b) of supplying a processing gas containing tungsten hexafluoride gas, a gas containing carbon and fluorine, and an oxygen-containing gas into the chamber. The etching method further includes step (c) of generating plasma from the processing gas to etch the silicon-containing film. Step (c) includes substituting a part of silicon atoms in the silicon-containing film with tungsten atoms on a bottom surface of a recess formed in the silicon-containing film by etching. Step (c) includes electrically biasing the substrate to remove the silicon-containing film in which a part of silicon atoms are substituted with tungsten atoms.

In yet another embodiment, a plasma processing apparatus is provided. The plasma processing apparatus includes a chamber, a substrate support, a gas supply, a plasma generator, and a DC power supply. The substrate support includes a lower electrode and is provided in the chamber. The gas supply is configured to supply a processing gas containing tungsten hexafluoride gas, a gas containing carbon and fluorine, and an oxygen-containing gas into the chamber. The plasma generator is configured to generate plasma from the processing gas in the chamber. The DC power supply is configured to periodically apply the negative DC voltage to the substrate support.

Hereinafter, various exemplary embodiments will be described in detail with reference to the drawings. In the respective drawings, similar or corresponding portions will be denoted by the same reference numerals.

FIG. 1 is a flowchart of an etching method according to an embodiment. The etching method (hereinafter, referred to as a "method MT") illustrated in FIG. 1 is performed to etch a silicon-containing film of a substrate to form a recess in the silicon-containing film.

Figure 2:
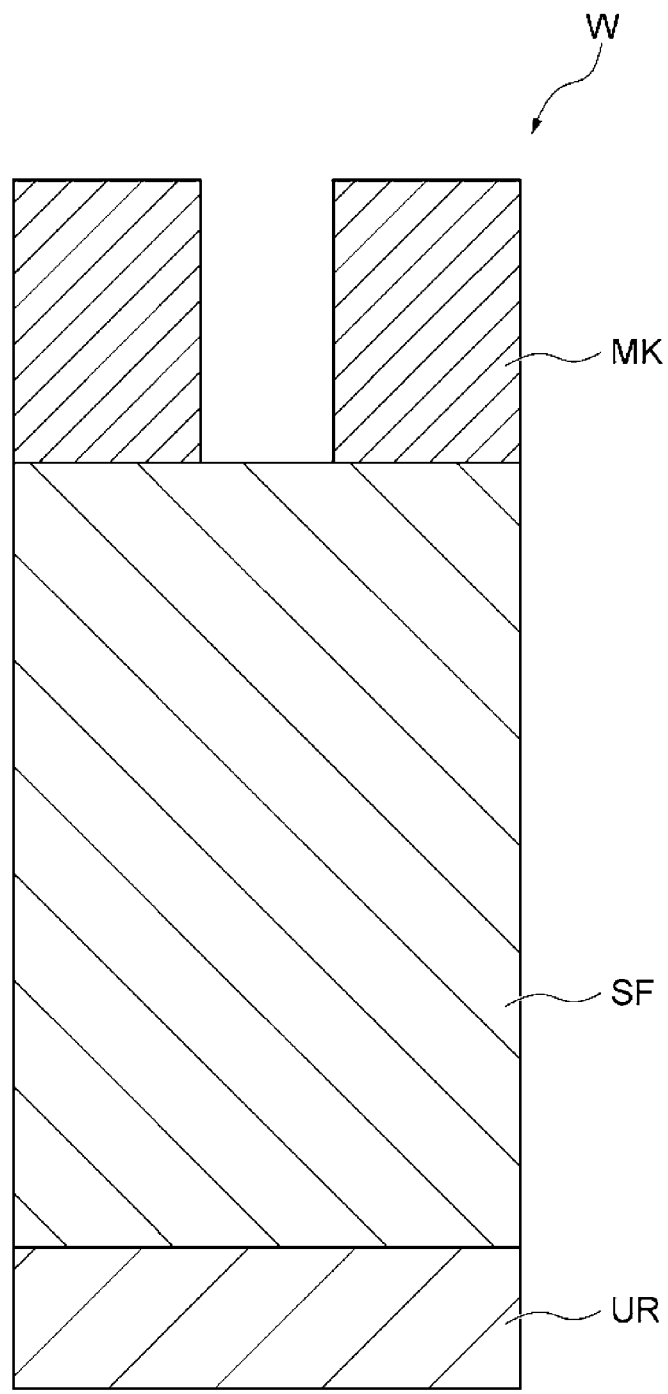
FIG. 2 is a partially enlarged cross-sectional view of an example of the substrate.
Figure 3:
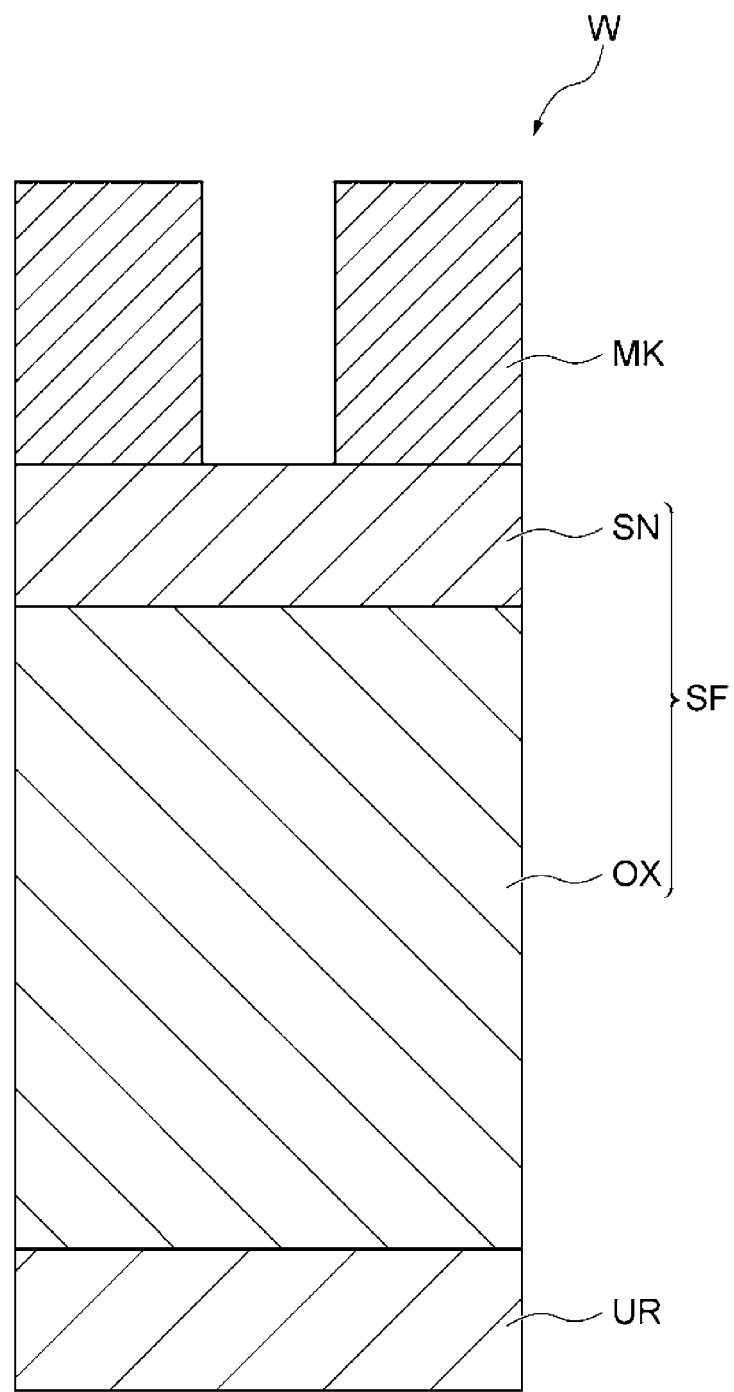
FIG. 3 is a partially enlarged cross-sectional view of another example of the substrate.

FIG. 2 is a partially enlarged cross-sectional view of an example of a substrate. FIG. 3 is a partially enlarged cross-sectional view of another example of a substrate. The method MT may be applied to a substrate W illustrated in FIG. 2 or 3. As illustrated in FIGS. 2 and 3, the substrate W includes a silicon-containing film SF. The substrate W may further include a mask MK and an underlying region UR. The silicon-containing film SF is provided on the underlying region UR. The mask MK is provided on the silicon-containing film SF. The mask MK is made of an organic material such as polycrystalline silicon or amorphous carbon. The mask MK has a pattern that is transferred to the silicon-containing film SF by etching. That is, the mask MK provides one or more openings.

The silicon-containing film SF is made of at least one material containing silicon. The silicon-containing film SF may contain a silicon oxide film OX. The silicon-containing film SF may be formed of a single-layer film of a silicon oxide film. The silicon-containing film SF may be formed of a multi-layer film including one or more silicon oxide films OX and one or more silicon nitride films SN. As illustrated in FIG. 3, the silicon-containing film SF may include a stacked film including the silicon oxide film OX and the silicon nitride film SN. The silicon nitride film SN may be provided on the silicon oxide film OX. The silicon-containing film SF may be formed of a multi-layer film including one or more silicon oxide films and one or more polycrystalline silicon films.

As illustrated in FIG. 1, the method MT starts by step STa. In step STa, the substrate W is prepared. In step STa, the substrate W is placed on the substrate support provided in the chamber of the plasma processing apparatus.

In the subsequent step STb, the processing gas is supplied into the chamber of the plasma processing apparatus. The processing gas contains tungsten hexafluoride gas ($WF_6$ gas), a gas containing carbon and fluorine, and an oxygen-containing gas. The processing gas may further contain nitrogen trifluoride gas ($NF_3$ gas). A ratio of a flow rate of the nitrogen trifluoride gas in the processing gas to a flow rate of the processing gas supplied into the chamber may be larger than a flow rate of the tungsten hexafluoride gas in the processing gas. The ratio of the flow rate of the $WF_6$ gas in the processing gas to the flow rate of the processing gas supplied into the chamber may be 5% by volume or less.

When the silicon-containing film SF includes the silicon oxide film OX, the gas containing carbon and fluorine in the processing gas contains a fluorocarbon gas. The fluorocarbon gas may contain one or more of $C_4F_6$ gas, $C_4F_8$ gas, $C_3F_8$ gas, and $CF_4$ gas. When the silicon-containing film SF may include the silicon nitride film SN, the gas containing carbon and fluorine in the processing gas may contain a hydrofluorocarbon gas. The hydrofluorocarbon gas may contain one or more of $CH_3F$ gas, $CH_2F_2$ gas, and $CHF_3$ gas. The oxygen-containing gas in the processing gas may contain one or more of $O_2$ gas, CO gas, and $CO_2$ gas.

Figure 4:
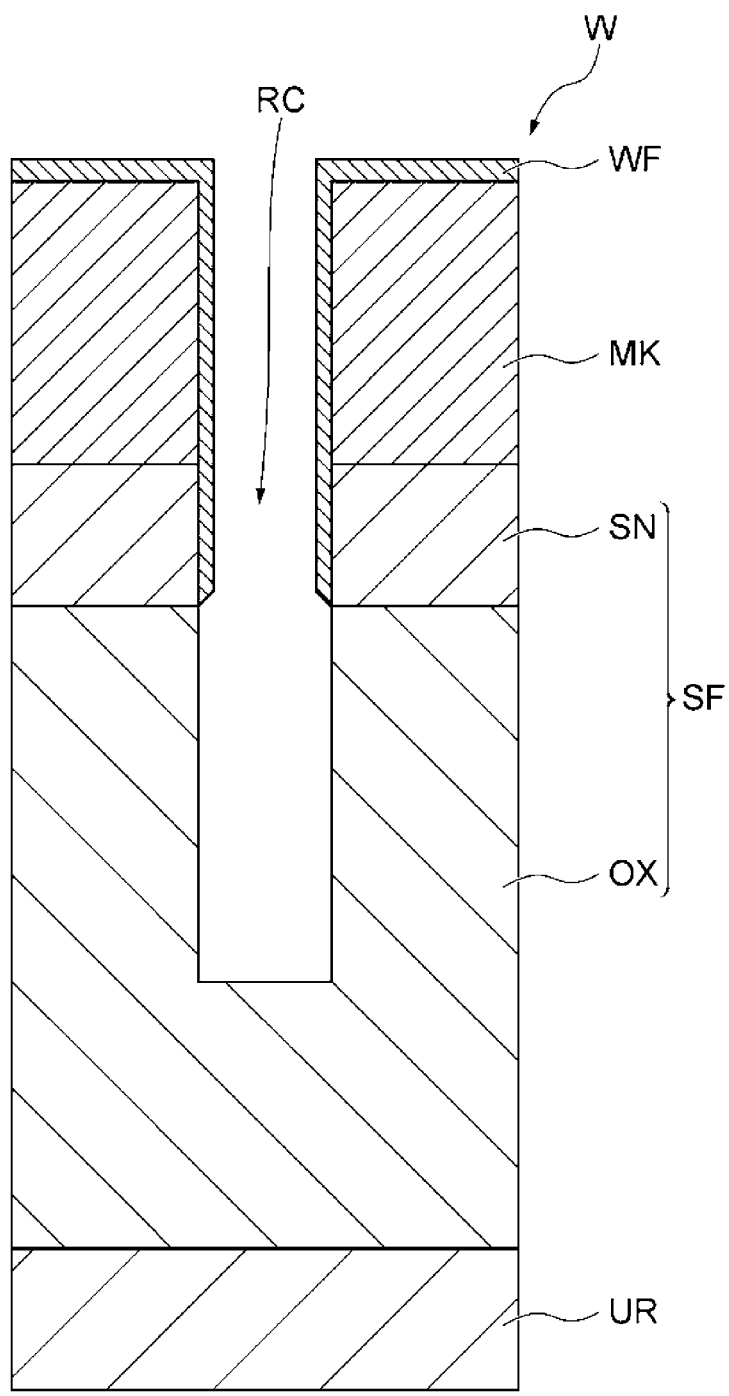
FIG. 4 is a partially enlarged cross-sectional view of an example of the substrate during the processing by step STc of the etching method illustrated in FIG. 1.

Step STc is performed during the supply of the processing gas into the chamber in step sm. Step STc includes step STc1 and step STc2. In step STc1, plasma is generated from the processing gas in the chamber. In step STc, the silicon-containing film SF is etched by the chemical species from the plasma. FIG. 4 is a partially enlarged cross-sectional view of an example of the substrate during the processing by step STc of the etching method illustrated in FIG. 1. As illustrated in FIG. 4, a recess RC is formed in the silicon-containing film SF by the etching in step STc. In step STc, a part of silicon atoms in the silicon-containing film SF are substituted with tungsten atoms supplied from the plasma on the bottom surface of the recess RC.

When the silicon-containing film SF includes the silicon nitride film SN, in step STc, a tungsten-containing film WF is formed on the side wall of the silicon nitride film SN that defines the recess RC. In step STc, the tungsten-containing film WF may be formed on the surface of the mask MK.

Step STc2 is performed when the plasma generated in step STc1 is present in the chamber. In step STc2, the silicon-containing film SF in which a part of silicon atoms are substituted with tungsten atoms is etched or removed. In step STc2, the substrate W is electrically biased. As a result, in step STc2, an electric bias EB is applied to the substrate support. The electric bias EB may be applied to the lower electrode in the substrate support.

In the embodiment, the electric bias EB is a voltage generated by waveform-shaping using a waveform generator with respect to the DC voltage generated by the DC power supply. The voltage which is the electric bias EB may have a rectangular pulse waveform, a triangular pulse waveform, and an arbitrary waveform. The voltage, which is the electric bias EB, is periodically applied to the substrate support. The polarity of the voltage, which is the electric bias EB, may be negative or positive as long as the potential of the substrate W is set so as to give a potential difference between the plasma and the substrate W and draw ions into the substrate W.

Figure 5:
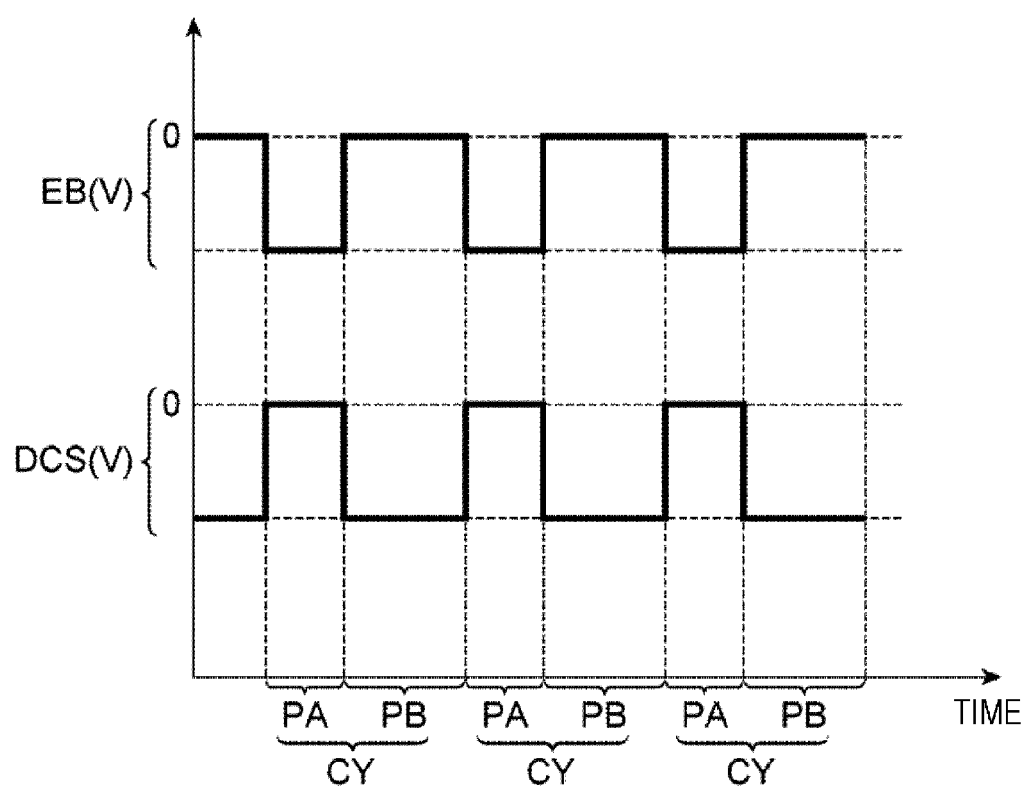
FIG. 5 is a timing chart related to step STc2 of the etching method illustrated in FIG. 1.

FIG. 5 is a timing chart related to step STc2 of the etching method illustrated in FIG. 1. In the embodiment, as illustrated in FIG. 5, in step STc2, a negative DC voltage serving as the electric bias EB is periodically applied to the substrate support in a cycle CY (time interval). The cycle CY includes a period PA and a period PB. The negative DC voltage is applied to the substrate support during the period PA. During the period PB, the application of the negative DC voltage to the substrate support is stopped. An absolute value of the negative DC voltage applied to the substrate support during the period PA may be 1 kV or more and 20 kV or less. A ratio of the period PA in the cycle CY, that is, a duty ratio of the negative DC voltage periodically applied to the substrate support in step STc may be 5% or more and 40% or less. The duty ratio may be 10% or more and 30% or less. Further, the frequency that defines the cycle CY, that is, a bias frequency, which is a reciprocal of the time interval in which the negative DC voltage is applied to the substrate support, may be 100 kHz or more and 1 MHz or less. The bias frequency may be 300 kHz or more and 800 kHz or less. The bias frequency may be 500 kHz or less. A time length of the cycle CY is a reciprocal of the bias frequency that defines the cycle CY. According to the negative DC voltage level applied to the substrate support, the duty ratio, and the frequency range in step STc, ions having sufficient energy may be supplied to the bottom of the recess RC, and the formation of the tungsten-containing film on the bottom of the recess RC may be suppressed.

Figure 6:
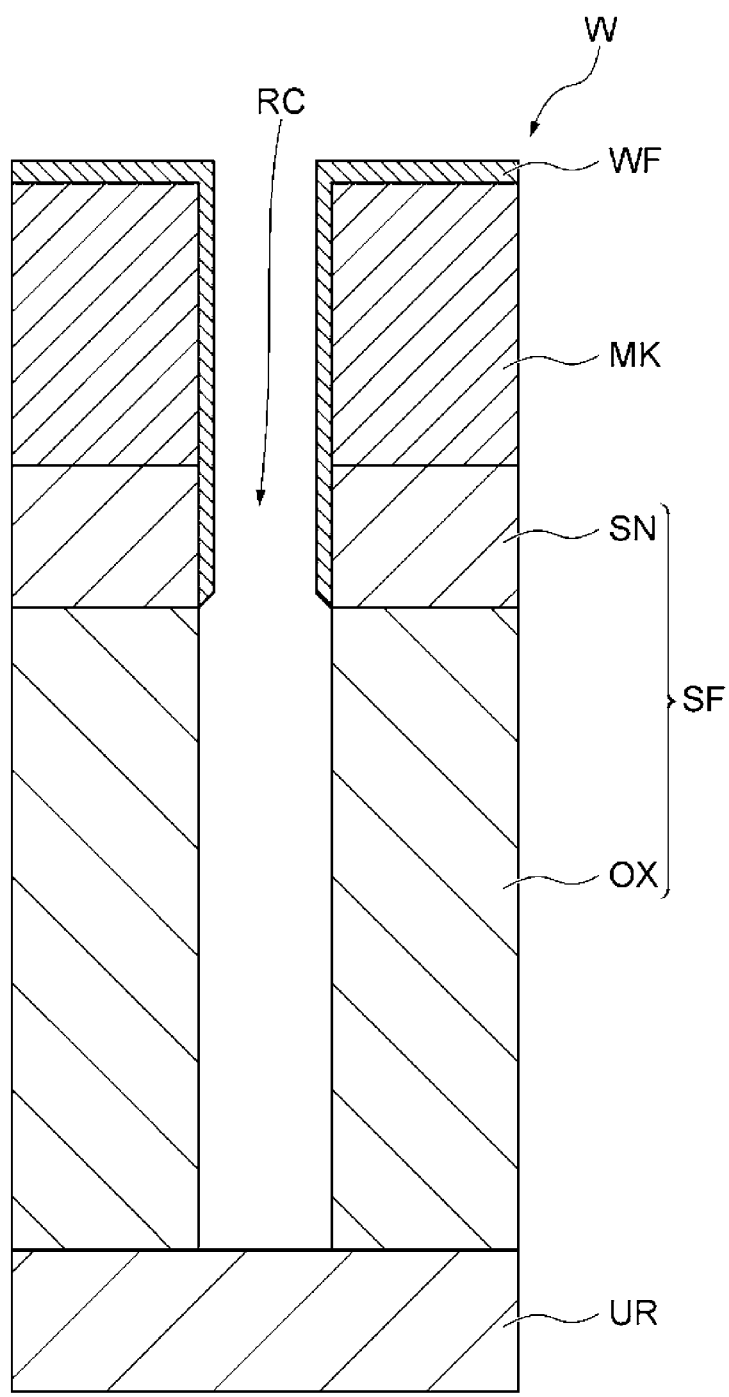
FIG. 6 is a partially enlarged cross-sectional view of an example of the substrate in a state after the etching method illustrated in FIG. 1 is executed.

FIG. 6 is a partially enlarged cross-sectional view of an example of the substrate in a state after the etching method illustrated in FIG. 1 is executed. As illustrated in FIG. 6, in step STc, the silicon-containing film SF may be etched until the recess RC reaches the surface of the underlying region UR. When step STc is completed, the method MT ends.

In the method MT, a part of silicon atoms in the silicon-containing film SF are substituted with tungsten on the bottom surface that defines the recess RC. Since the atomic weight of tungsten is larger than the atomic weight of silicon, the portion of the silicon-containing film SF in which a part of silicon atoms are substituted with tungsten becomes chemically unstable. Further, in the portion, fluorine ions from the plasma are easily electrically attracted. Further, when the silicon-containing film SF includes the silicon oxide film OX, the bonding energy between tungsten and oxygen is lower than the bonding energy between silicon and oxygen, and thus, the portion is easily etched. Therefore, according to the method MT, a high etching rate of the silicon-containing film SF is obtained. Further, since the etching rate of the silicon-containing film SF is high, the time in which the side wall of the silicon-containing film SF is exposed to chemical species from the plasma is shortened. As a result, bowing of the silicon-containing film SF, for example, the silicon oxide film OX is suppressed.

In the embodiment, the plasma processing apparatus used in the method MT may be a capacitively coupled plasma processing apparatus. That is, the plasma processing apparatus may further include an upper electrode. The upper electrode is provided above the substrate support. In step STc, another electric bias DCS may be applied to the upper electrode. Specifically, as illustrated in FIG. 5, in step STc, a negative DC voltage serving as the electric bias DCS is applied to the upper electrode during the period PB in the cycle CY. That is, in step STc, when a negative DC voltage is not applied to the substrate support, a negative DC voltage is applied to the upper electrode. In the embodiment, it is possible to supply a relatively large amount of secondary electrons released from the upper electrode to the substrate W. Therefore, it is possible to neutralize the charge at the bottom of the recess RC. During the period PA, the application of the negative DC voltage to the upper electrode may be stopped. Alternatively, an absolute value of the negative DC voltage applied to the upper electrode during the period PA may be smaller than an absolute value of the negative DC voltage applied to the upper electrode during the period PB.

In the embodiment, during the period in which step STc is performed, the pressure in the chamber may be set to a pressure less than 10 mTorr (1.333 Pa). In this case, excessive dissociation of a gas containing carbon and fluorine such as a fluorocarbon gas is suppressed. As a result, excessive deposition of a carbon-containing substance on the substrate W is suppressed. Further, it is possible to suppress the ions, which are rebounded by colliding with the carbon-containing substance deposited on the side wall defining the recess RC, from causing bowing in the silicon oxide film OX.

During the period in which step STc is performed, the temperature of the substrate support may be set to a temperature of 0° C. or higher, and 120° C. or lower. When the temperature of the substrate support is lower than 0° C. in step STc, the adhesion coefficient of deposits to the mask MK is high, and thus, blockage (clogging) due to the deposits on the mask MK may occur, which causes poor etching. Further, when the temperature of the substrate support is higher than 120° C. in step STc, the adhesion coefficient of the deposits to the mask MK is low, and thus, the amount of the deposits in a recess RC may be excessive, which causes poor etching.

Further, as described above, when the processing gas further contains nitrogen trifluoride gas, the amount of the carbon-containing substance deposited on the upper portion of the mask MK may be adjusted. As a result, the reduction or blockage of the opening of the mask MK may be suppressed.

Further, as described above, in the embodiment, the ratio of the flow rate of the nitrogen trifluoride gas in the processing gas to the flow rate of the processing gas supplied into the chamber may be larger than the flow rate of the tungsten hexafluoride gas in the processing gas. In this case, the excessive deposition of a tungsten-containing substance on the substrate W is suppressed.

Further, as described above, in the embodiment, the ratio of the flow rate of the tungsten hexafluoride gas in the processing gas to the flow rate of the processing gas supplied into the chamber may be 5% by volume or less. In this case, the excessive deposition of the tungsten-containing substance on the bottom surface that defines the recess RC is suppressed.

In the embodiment, step STc may include etching the silicon nitride film SN in a state where the bias frequency is set to a first frequency, and etching the silicon oxide film OX in a state where the bias frequency is set to a second frequency. The first frequency may be 200 kHz or more and 300 kHz or less. The second frequency is larger than the first frequency. In a state where the bias frequency is set to the first frequency, the main chemical species that contribute to etching are radicals. Meanwhile, in a state where the bias frequency is set to the second frequency, the main chemical species that contribute to etching are ions. Therefore, in this case, the silicon nitride film SN may be etched by radicals from the plasma. Further, the silicon oxide film OX may be etched by ions from the plasma.

Figure 7:
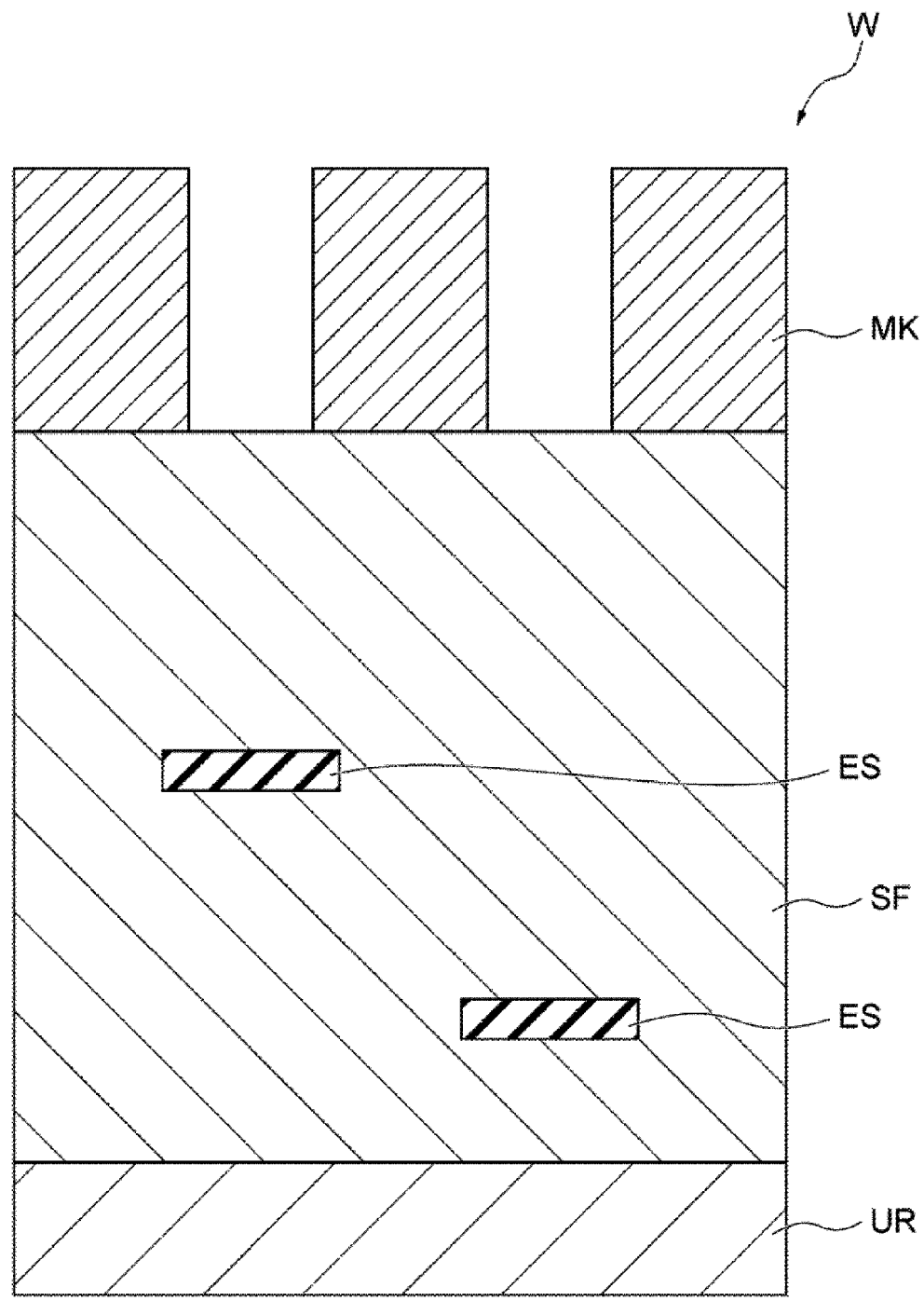
FIG. 7 is a partially enlarged cross-sectional view of another example of a substrate.

Hereinafter, reference will be made to FIG. 7. FIG. 7 is a partially enlarged cross-sectional view of another example of a substrate. The method MT may be applied to a substrate W illustrated in FIG. 7. The substrate W illustrated in FIG. 7 includes an underlying region UR, a silicon-containing film SF, and a mask MK, similarly to the substrate W illustrated in FIG. 2 or 3. The mask MK provides a plurality of openings. The substrate W illustrated in FIG. 7 further includes a plurality of etching stop layers ES. Each of the plurality of etching stop layers ES is provided in the silicon-containing film SF between a corresponding opening of the plurality of openings of the mask MK and the underlying region UR. The positions of the plurality of etching stop layers ES in the film thickness direction in the silicon-containing film SF are different from each other. The plurality of etching stop layers ES are made of, for example, tungsten. When the method MT is applied to the substrate W illustrated in FIG. 7, the etching of the silicon-containing film SF in step STc may be stopped at the plurality of etching stop layers ES.

Figure 8:
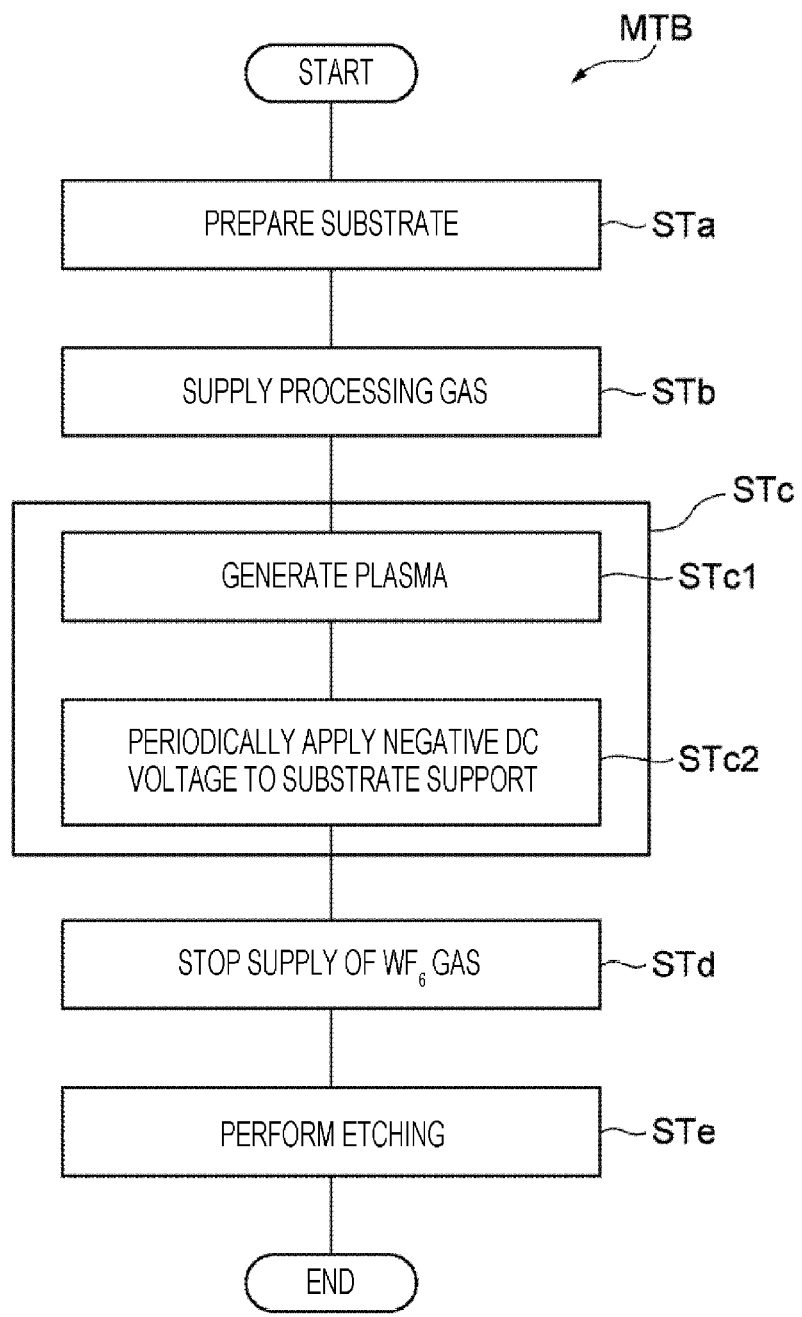
FIG. 8 is a flowchart of an etching method according to another embodiment.

Hereinafter, reference will be made to FIG. 8. FIG. 8 is a flowchart of an etching method according to another embodiment. A method MTB illustrated in FIG. 8 includes step STa, step STb, and step STc, similarly to the method MT. The method MTB further includes step STd and step STe. Step STd and step STe are performed after step STc.

Step STd is started before the recess RC formed by the etching in step STc reaches the underlying region UR or the etching stop layer ES. Further, step STd is performed in a period including a time when the underlying region UR or the etching stop layer ES is exposed. In step STd, the supply of the tungsten hexafluoride gas among all the gases contained in the processing gas supplied into the chamber from step STb is stopped. The other gases contained in the processing gas supplied into the chamber from step STb may continuously be supplied into the chamber after step STd.

Step STe is performed after step STd. In step STe, the state where the supply of the tungsten hexafluoride gas is stopped and the other gases contained in the processing gas are supplied into the chamber is continued. In step STe, plasma is generated in the chamber from a gas other than the tungsten hexafluoride gas contained in the processing gas. In step STe, the silicon-containing film SF is etched by the chemical species from the plasma. In step STe, plasma is generated in the same manner as in step STc. Further, in step STe, the electric bias EB is periodically applied to the substrate support, similarly to step STc. According to the method MTB, the deposition of the tungsten-containing substance on the underlying region UR or the etching stop layer ES is suppressed.

Figure 9:
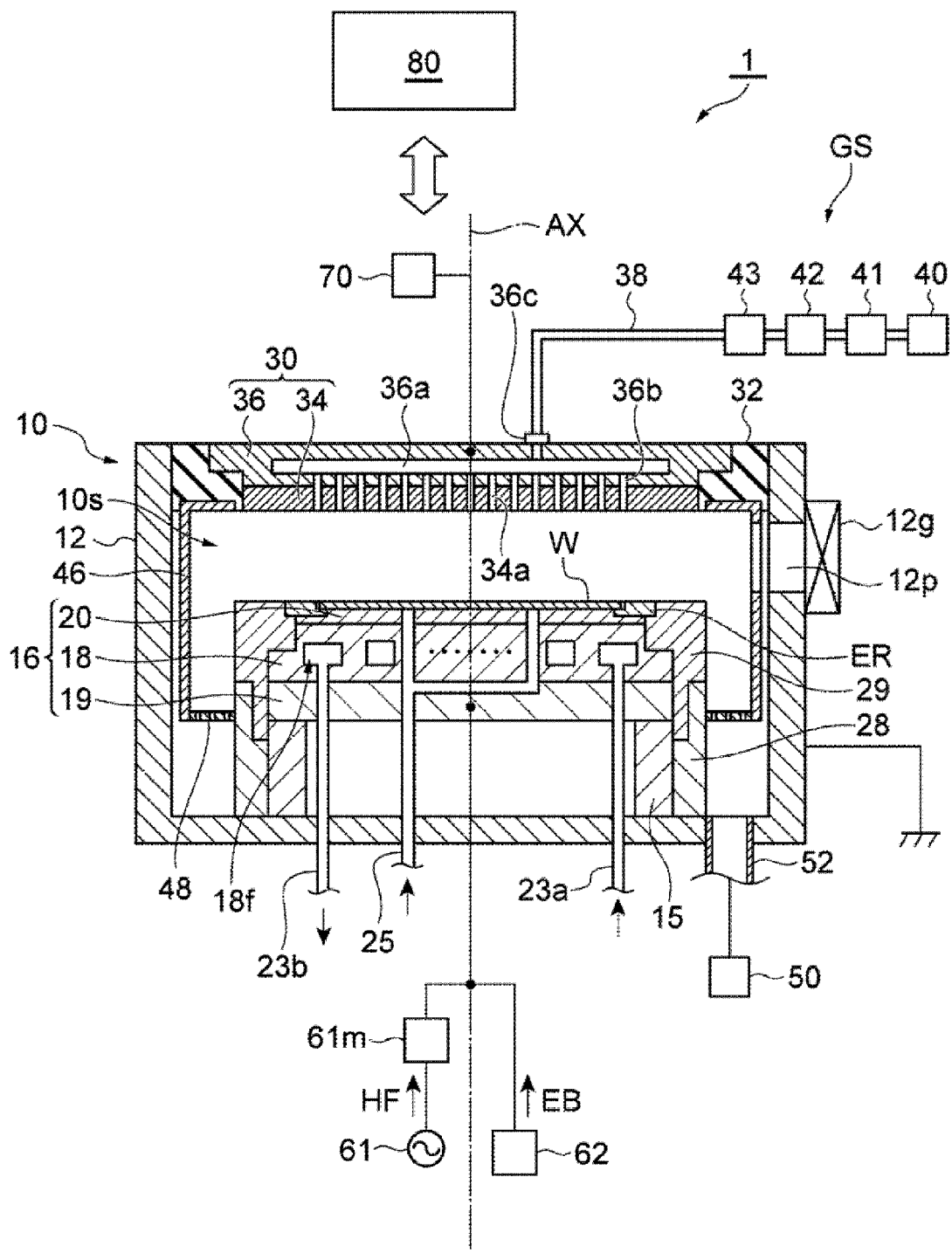
FIG. 9 is a schematic view illustrating a plasma processing apparatus according to an embodiment.

Hereinafter, descriptions will be made on a plasma processing apparatus that may be used to execute the method MT. FIG. 9 is a schematic view illustrating a plasma processing apparatus according to an embodiment. A plasma processing apparatus 1 illustrated in FIG. 9 may be used in the method MT and the method MTB. The plasma processing apparatus 1 is a capacitively coupled plasma processing apparatus.

The plasma processing apparatus 1 includes a chamber 10. The chamber 10 provides an internal space 10s therein. A central axis of the chamber 10 is a vertically extending axis AX. In the embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having corrosion resistance is provided on an inner wall surface of the chamber body 12. The corrosion-resistant film may be a film made of ceramic such as aluminum oxide or yttrium oxide.

The chamber body 12 provides a passage 12p in the side wall. The substrate W passes through the passage 12p when being transferred between the internal space 10s and the outside of the chamber 10. The passage 12p is openable/closable by a gate valve 12g. The gate valve 12g is provided along the side wall of the chamber body 12.

The plasma processing apparatus 1 further includes a substrate support 16. The substrate support 16 is configured to support the substrate W in the chamber 10. The substrate W may have a substantially disc shape. The substrate support 16 may be supported by a support 15. The support 15 extends upward from a bottom of the chamber body 12. The support 15 has a substantially cylindrical shape. The support 15 is made of an insulating material such as quartz.

The substrate support 16 includes a base 18. The substrate support 16 may further include an electrostatic chuck 20. Further, the substrate support 16 may further include an electrode plate 19. The electrode plate 19 is made of a conductive material such as aluminum. The electrode plate 19 has a substantially disc shape, and the central axis thereof is the axis AX. The base 18 is provided on the electrode plate 19. The base 18 is made of a conductive material such as aluminum. The base 18 has a substantially disc shape, and the central axis thereof is the axis AX. The base 18 is electrically connected to the electrode plate 19.

A flow path 18f is provided in the base 18. The flow path 18f is a flow path for a heat exchange medium (e.g., coolant). The flow path 18f receives the heat exchange medium from a supply device (e.g., chiller unit) via a pipe 23a. The supply device is provided outside the chamber 10. The heat exchange medium supplied to the flow path 18f flows through the flow path 18f, and returns to the supply device via a pipe 23b. The heat exchange medium supply device constitutes a temperature adjusting mechanism of the plasma processing apparatus 1.

The electrostatic chuck 20 is provided on the base 18. The substrate W is placed on the upper surface of the electrostatic chuck 20. The electrostatic chuck 20 includes a body and a chuck electrode. The body of the electrostatic chuck 20 is made of a dielectric. Each of the electrostatic chuck 20 and the body thereof has a substantially disc shape, and the central axis thereof is the axis AX. The chuck electrode is a film made of a conductor, and is provided in the body of the electrostatic chuck 20. The chuck electrode is connected to a DC power supply via a switch. When a voltage from the DC power supply is applied to the chuck electrode, an electrostatic attractive force is generated between the electrostatic chuck 20 and the substrate W. Due to the generated electrostatic attractive force, the substrate W is attracted to the electrostatic chuck 20 and held by the electrostatic chuck 20.

The substrate support 16 may further support an edge ring ER disposed thereon. The edge ring ER may be made of silicon, silicon carbide, or quartz. The substrate W is disposed on the electrostatic chuck 20 and in an area surrounded by the edge ring ER.

The plasma processing apparatus 1 may further include a gas supply line 25. The gas supply line 25 supplies a heat transfer gas (e.g., He gas) from a gas supply mechanism to a gap between the upper surface of the electrostatic chuck 20 and the rear surface (lower surface) of the substrate W.

The plasma processing apparatus 1 may further include a cylindrical portion 28 and an insulating portion 29. The cylindrical portion 28 extends upward from the bottom of the chamber body 12. The cylindrical portion 28 extends along the outer peripheral surface of the support 15. The cylindrical portion 28 is made of a conductive material and has a substantially cylindrical shape. The cylindrical portion 28 is electrically grounded. The insulating portion 29 is provided on the cylindrical portion 28. The insulating portion 29 is made of an insulating material. The insulating portion 29 is made of, for example, ceramic such as quartz. The insulating portion 29 has a substantially cylindrical shape. The insulating portion 29 extends along the outer periphery of the electrode plate 19, the outer periphery of the base 18, and the outer periphery of the electrostatic chuck 20.

The plasma processing apparatus 1 further includes an upper electrode 30. The upper electrode 30 is provided above the substrate support 16. The upper electrode 30 is supported in the upper portion of the chamber body 12 via a member 32. The member 32 is made of an insulating material. The upper electrode 30 and the member 32 close the upper opening of the chamber body 12.

The upper electrode 30 may include an upper plate 34 and a support 36. A lower surface of the upper plate 34 is the lower surface on the internal space 10s side, and defines the internal space 10s. The upper plate 34 may be formed of a low resistance conductor or a semiconductor having low Joule heat. In the embodiment, the upper plate 34 is made of silicon. A plurality of gas holes 34a is provided in the upper plate 34. The plurality of gas holes 34a penetrate the upper plate 34 in the thickness direction of the plate.

The support 36 detachably supports the upper plate 34. The support 36 may be made of a conductive material such as aluminum. A gas diffusion chamber 36a is provided inside the support 36. A plurality of gas holes 36b is provided in the support 36. The plurality of gas holes 36b extend downward from the gas diffusion chamber 36a. The plurality of gas holes 36b communicate with the plurality of gas holes 34a, respectively. A gas introducing port 36c is further provided in the support 36. The gas introducing port 36c is connected to the gas diffusion chamber 36a. A gas supply pipe 38 is connected to the gas introducing port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply GS. The gas source group 40 includes a plurality of gas sources. The plurality of gas sources of the gas source group 40 include a plurality of gas sources used in the method MT or the method MTB. Each of the valve group 41 and the valve group 43 includes a plurality of opening/closing valves. The flow rate controller group 42 includes a plurality of flow rate controllers. Each of the plurality of flow controllers of the flow controller group 42 is a mass flow controller or a pressure control type flow controller. Each of the plurality of gas sources of the gas source group 40 is connected to the gas supply pipe 38 via a corresponding opening/closing valve of the valve group 41, a corresponding flow rate controller of the flow rate controller group 42, and a corresponding opening/closing valve of the valve group 43.

The plasma processing apparatus 1 may further include a shield 46. The shield 46 is provided detachably along the inner wall surface of the chamber body 12. The shield 46 suppresses byproducts of the plasma processing from being attached to the chamber body 12. The shield 46 is configured by, for example, forming a corrosion-resistant film on the surface of a member made of aluminum. The corrosion-resistant film may be a film made of ceramic such as yttrium oxide.

The plasma processing apparatus 1 may further include a baffle member 48. The baffle member 48 is provided between a member (e.g., the cylindrical portion 28) surrounding the substrate support 16 and the shield 46. The baffle member 48 is formed by, for example, forming a film having corrosion resistance on the surface of a member made of aluminum. The corrosion-resistant film may be a film made of ceramic such as yttrium oxide. The baffle member 48 has a plurality of through holes. An exhaust port is provided at the bottom of the chamber body 12 below the baffle member 48. An exhaust device 50 is connected to the exhaust port via an exhaust pipe 52. The exhaust device 50 includes a pressure adjusting valve and a vacuum pump such as a turbo molecular pump.

The plasma processing apparatus 1 further includes a radio-frequency power supply 61 and a bias power supply 62. The radio-frequency power supply 61 is configured to generate a radio-frequency power (hereinafter, referred to as a "radio-frequency power HF"). The radio-frequency power HF has a frequency suitable for plasma generation. The frequency of the radio-frequency power HF is, for example, 27 MHz or more and 100 MHZ or less. The radio-frequency power supply 61 is connected to an electrode in the substrate support 16 via a matcher 61m. The matcher 61m has a circuit for matching the impedance of a load side of the radio-frequency power supply 61 and the output impedance of the radio-frequency power supply 61 with each other. In the embodiment, the radio-frequency power supply 61 constitutes a plasma generating unit. The electrode in the substrate support 16 to which the radio-frequency power supply 61 is connected may be the base 18. In this case, the base 18 constitutes a lower electrode. The electrode in the substrate support 16 to which the radio-frequency power supply 61 is connected may be an electrode provided in the electrostatic chuck 20. The radio-frequency power supply 61 may be connected to the upper electrode 30 via the matcher 61m.

The bias power supply 62 is configured to periodically apply the electric bias EB to the substrate support 16. As described above, the electric bias EB is a voltage generated by waveform-shaping using a waveform generator with respect to the DC voltage generated by the DC power supply. The voltage which is the electric bias EB may have a rectangular pulse waveform, a triangular pulse waveform, and an arbitrary waveform. The polarity of the voltage which is the electric bias EB may be negative or positive as long as the potential of the substrate W is set so as to give a potential difference between the plasma and the substrate W and draw ions into the substrate W. The electrode in the substrate support 16 to which the electric bias EB is applied from the bias power supply 62 may be the base 18. In this case, the base 18 constitutes a lower electrode. The electrode in the substrate support 16 to which the electric bias EB is applied from the bias power supply 62 may be an electrode provided in the electrostatic chuck 20.

In the embodiment, as described above, the bias power supply 62 is configured to periodically apply a negative DC voltage to the substrate support 16 as the electric bias EB in step STc2 in the method MT. The negative DC voltage from the bias power supply 62 is applied to the substrate support 16 during the period PA in the cycle CY as described above. During the period PB in the cycle CY, the application of the negative DC voltage from the bias power supply 62 to the substrate support 16 is stopped.

In the embodiment, the plasma processing apparatus 1 may further include a DC power supply 70. The DC power supply 70 is configured to apply the above-described electric bias DCS to the upper electrode 30. That is, the DC power supply 70 is configured to periodically apply a negative DC voltage to the upper electrode 30 as the electric bias DCS. The negative DC voltage from the DC power supply 70 is applied to the upper electrode 30 during the period PB in the cycle CY as described above. During the period PA in the cycle CY, the application of the negative DC voltage from the DC power supply 70 to the lower electrode 30 may be stopped. Alternatively, an absolute value of the negative DC voltage applied to the upper electrode during the period PA may be smaller than an absolute value of the negative DC voltage applied to the upper electrode during the period PB.

The plasma processing apparatus 1 may further include a controller 80. The controller 80 is a computer including, for example, a processor, a storage device, an input device, and a display device, and controls each part of the plasma processing apparatus 1. Specifically, the controller 80 executes a control program stored in the storage device to control each part of the plasma processing apparatus 1 based on a recipe data stored in the storage device. A process designated by the recipe data is executed in the plasma processing apparatus 1 by the control of the controller 80. The method MT and the method MTB may be executed in the plasma processing apparatus 1 by controlling each part of the plasma processing apparatus 1 by the controller 80.

When the method MT or the method MTB is applied to the substrate W by using the plasma processing apparatus 1, the substrate W is placed on the substrate support 16 in step STa. In the subsequent step STb, the controller 80 controls the gas supply GS to supply the above-described processing gas into the chamber 10. In the subsequent step STc, the controller 80 controls the exhaust device 50 such that the pressure in the chamber 10 is set to a designated pressure. Further, in step STc, the controller 80 controls the plasma generating unit to generate plasma from the processing gas in the chamber 10. Specifically, the controller 80 controls the radio-frequency power supply 61 so as to supply the radio-frequency power HF. Further, in step STc, the controller 80 controls the bias power supply 62 such that the electric bias EB is periodically applied to the substrate support 16. In the embodiment, the controller 80 controls the DC power supply 70 such that a negative DC voltage is periodically applied to the upper electrode 30 as the above-described electric bias DCS in step STc.

When the method MTB is applied to the substrate W by using the plasma processing apparatus 1, in step STd, the controller 80 controls the gas supply GS such that the supply of the tungsten hexafluoride gas contained in the processing gas supplied to the chamber from step STb is stopped. In step STe, the controller 80 controls the plasma generator such that plasma is generated from a gas other than the tungsten hexafluoride gas contained in the processing gas, in order to further etch the silicon-containing film SF. Specifically, the controller 80 controls the radio-frequency power supply 61 so as to supply the radio-frequency power HF. Further, in step STe, the controller 80 controls the bias power supply 62 such that the electric bias EB is periodically applied to the substrate support 16.

Although various embodiments have been described above, the present disclosure is not limited to the exemplary embodiments described above, and various additions, omissions, substitutions, and modifications may be made. Further, it is possible to combine the elements in different embodiments to form other embodiments.

For example, the plasma processing apparatus used in the method MT may be a plasma processing apparatus of a type other than the capacitively coupled type. Such plasma processing apparatus is, for example, an inductively coupled plasma processing apparatus, an electron cyclotron resonance (ECR) plasma processing apparatus, or a plasma processing apparatus that generates plasma using a surface wave such as a microwave.

Figure 10:
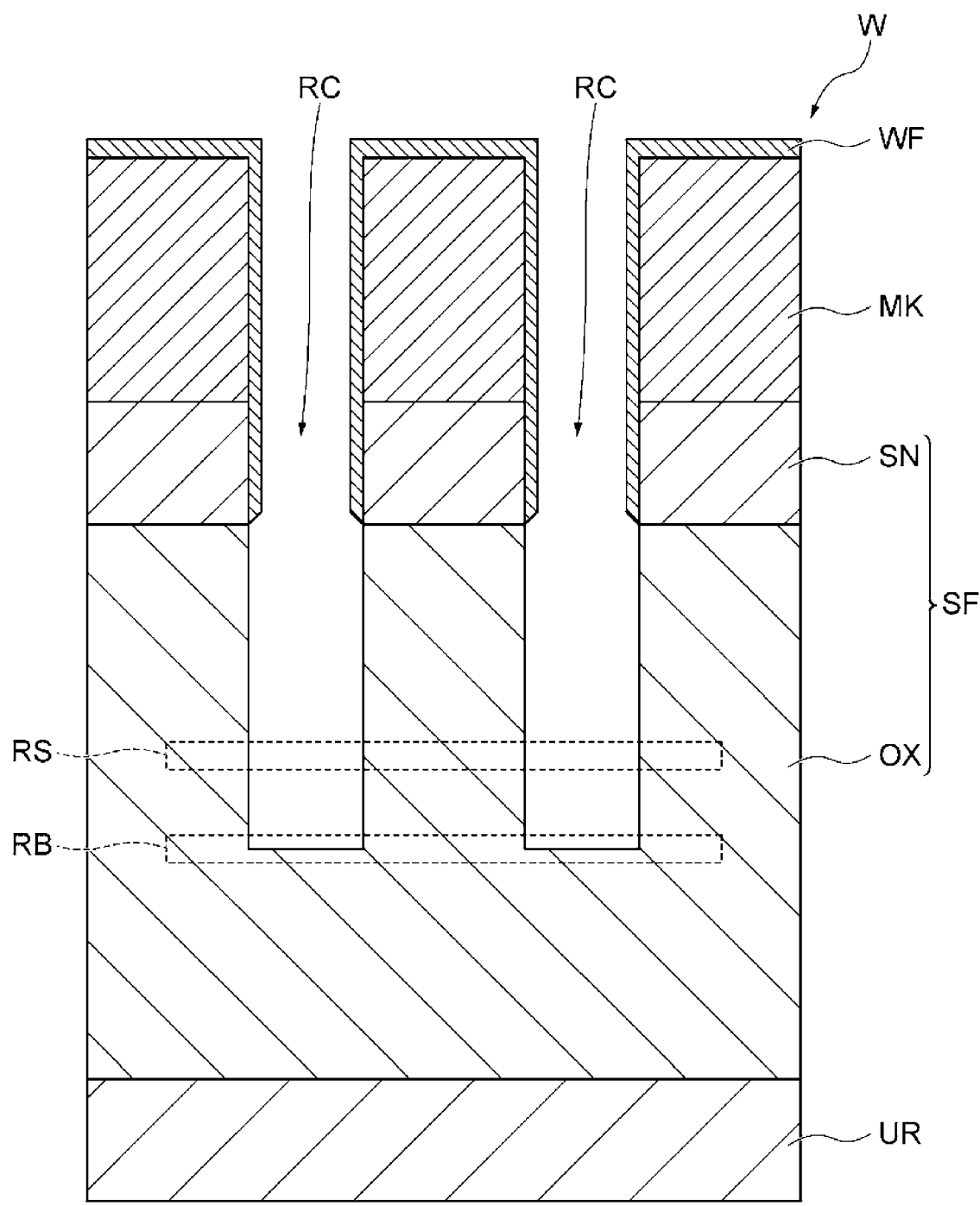
FIG. 10 is a schematic cross-sectional view illustrating a part of a sample substrate etched in an experiment.

Hereinafter, descriptions will be made on an experiment performed for evaluation of the method MT. In the experiment, a sample substrate having the same structure as that of the substrate W illustrated in FIG. 3 is used. In the experiment, the method MT is applied to the sample substrate by using the plasma processing apparatus 1. In the experiment, the silicon-containing film SF is etched to the depth between the upper surface and the lower surface of the silicon oxide film OX. The processing gas used in the experiment is a mixed gas of $C_4F_8$ gas, $C_4F_6$ gas, $O_2$ gas, and $WF_6$ gas. FIG. 10 is a schematic cross-sectional view illustrating a part of a sample substrate etched in an experiment. In the experiment, the concentration of each of silicon Si and tungsten W in a region RB and a region RS illustrated in FIG. 10, that is, the atomic fraction is measured by TEM/EDX. The region RB includes the bottom surface of the silicon oxide film OX that defines the recess RC. The region RS includes the side surface of the silicon oxide film OX that defines the recess RC.

Figure 11A:
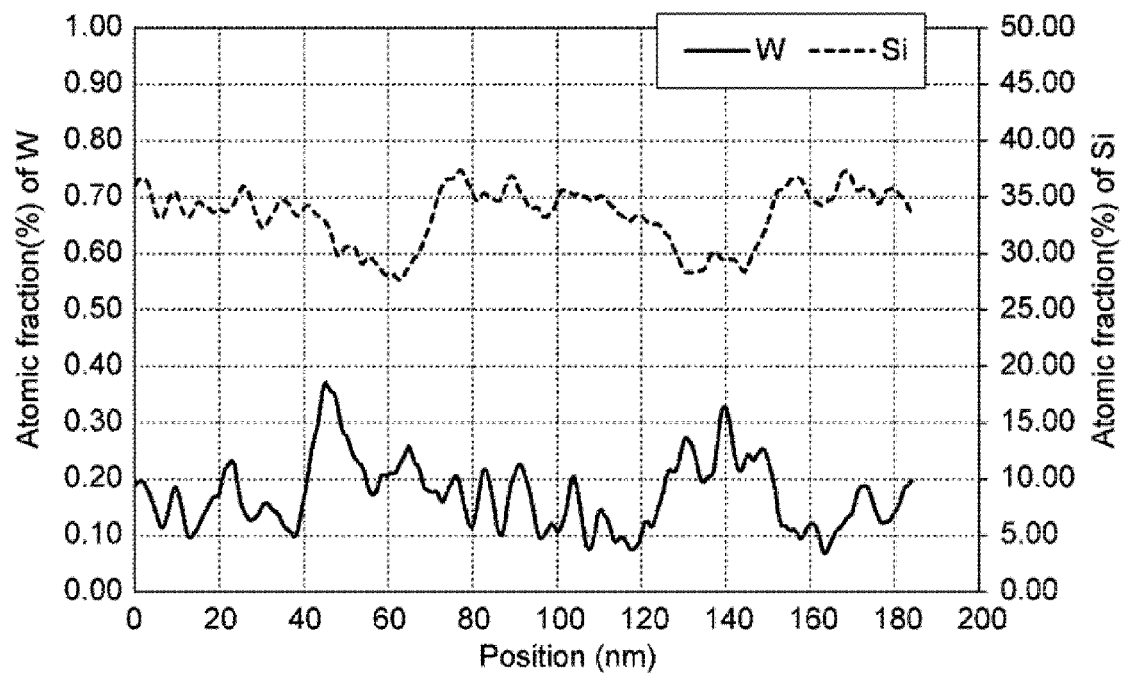
FIG. 11A is a graph illustrating an atomic fraction of each of silicon and tungsten in a region RS obtained in the experiment.
Figure 11B:
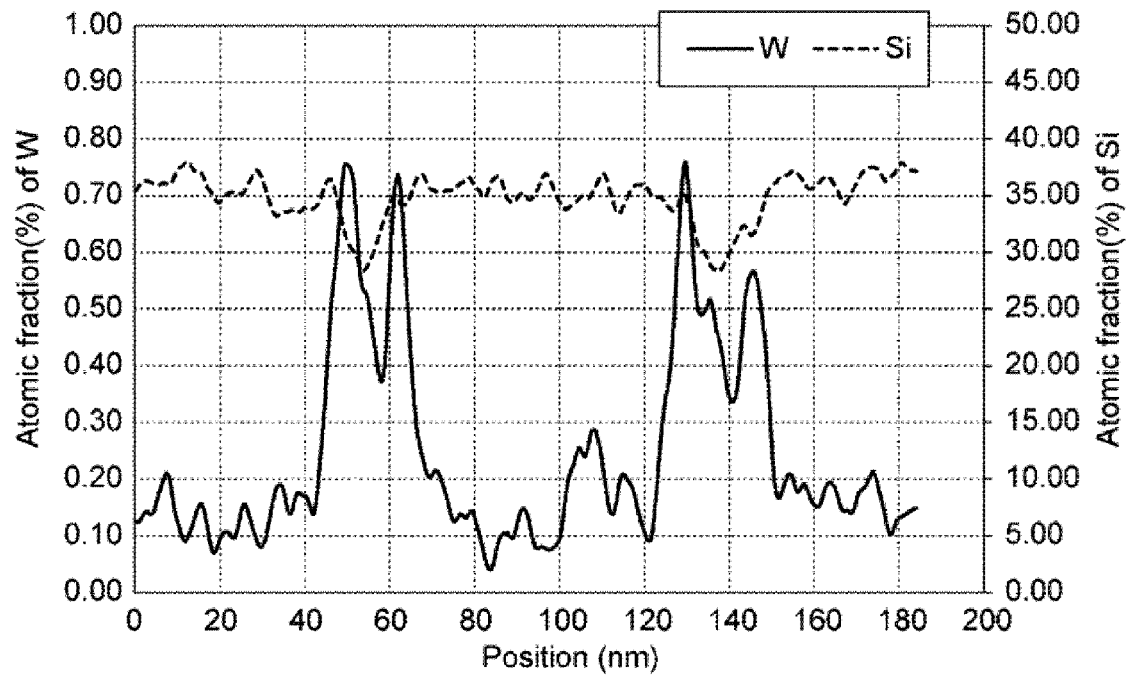
FIG. 11B is a graph illustrating an atomic fraction of each of silicon and tungsten in a region RB obtained in the experiment.

FIG. 11A is a graph illustrating the atomic fraction of each of silicon Si and tungsten W in the region RS obtained in the experiment. FIG. 11B is a graph illustrating the atomic fraction of each of silicon Si and tungsten W in the region RB obtained in the experiment. The horizontal axis in FIG. 11A represents the position in the region RS in the horizontal direction, and the horizontal axis in FIG. 11B represents the position in the region RB in the horizontal direction. As illustrated in FIG. 11A, a large peak of the concentration of tungsten is not detected in the region RS. Meanwhile, as illustrated in FIG. 11B, in the region RB, a large peak of the concentration of tungsten is detected at locations including the bottom surface that defines the recess RC. Therefore, according to the method MT, it is confirmed that a part of silicon atoms are substituted with tungsten atoms at the locations including the bottom surface that defines the recess RC.

According to one embodiment, it is possible to suppress an abnormality in the shape of the recess formed in the silicon-containing film suppressed, and proceed the etching of the bottom of the recess.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising,
   (a) preparing a substrate including a silicon-containing film that includes a silicon oxide film and placed on a substrate support provided in a chamber;
   (b) supplying a processing gas containing tungsten hexafluoride gas, a gas containing carbon and fluorine, and an oxygen-containing gas into the chamber; and
   (c) generating plasma from the processing gas to etch the silicon-containing film, which includes:
   applying a first negative DC voltage to the substrate support when a second negative DC voltage is not applied to an upper electrode provided above the substrate support; and applying the second negative DC voltage to the upper electrode provided above the substrate support when the first negative DC voltage is not applied to the substrate support.

2. The etching method according to claim 1, wherein a pressure in the chamber in (c) is set to less than 1.333 Pa.

3. The etching method according to claim 1, wherein a ratio of a flow rate of the tungsten hexafluoride gas in the processing gas to a flow rate of the processing gas is 5% by volume or less.

4. The etching method according to claim 1, wherein the processing gas further contains nitrogen trifluoride gas.

5. The etching method according to claim 4, wherein a ratio of a flow rate of the nitrogen trifluoride gas in the processing gas to a flow rate of the processing gas is larger than a ratio of a flow rate of the tungsten hexafluoride gas in the processing gas to the flow rate of the processing gas.

6. The etching method according to claim 1, wherein the processing gas contains a fluorocarbon gas as the gas containing carbon and fluorine.

7. The etching method according to claim 6, wherein the silicon-containing film further includes a silicon nitride film.

8. The etching method according to claim 7, wherein, in (c), a tungsten-containing film is formed on a side wall formed on the silicon nitride film by the etching.

9. The etching method according to claim 6, wherein the silicon-containing film further includes a polycrystalline silicon film.

10. The etching method according to claim 1, wherein the silicon-containing film further includes a silicon nitride film, and
    the processing gas contains a hydrofluorocarbon gas as the gas containing carbon and fluorine.

11. The etching method according to claim 1, wherein the silicon-containing film includes a stacked film including the silicon oxide film and the silicon nitride film, and
    step (c) includes:
    etching the silicon nitride film in a state where the bias frequency is set to a first frequency the bias frequency being a reciprocal of a time interval in which the negative DC voltage is applied to the substrate support, and
    etching the silicon oxide film in a state where the bias frequency is set to a second frequency larger than the first frequency.

12. The etching method according to claim 1, wherein, in step (c), a temperature of the substrate support is set to 0° C. or higher and 120° C. or lower.

13. The etching method according to claim 1, wherein, in step (c), an absolute value of the negative DC voltage applied to the substrate support is 1 kV or more and 20 kV or less.

14. The etching method according to claim 1, wherein the substrate further includes an underlying region or an etching stop layer, and
    the etching method further includes
    (d) stopping the supply of the tungsten hexafluoride gas in the processing gas during a period including a time when the underlying region or the etching stop layer is exposed, and
    (e) etching the silicon-containing film with plasma generated from a gas other than the tungsten hexafluoride gas contained in the processing gas.

15. An etching method comprising:
    (a) preparing a substrate including a silicon-containing film including a silicon oxide film and placed on a substrate support provided in a chamber;
    (b) supplying a processing gas containing tungsten hexafluoride gas, a gas containing carbon and fluorine, and an oxygen-containing gas into the chamber; and
    (c) generating plasma from the processing gas to etch the silicon-containing film,
    wherein step (c) includes
    substituting a part of silicon atoms in the silicon-containing film with tungsten atoms on a bottom surface of a recess formed in the silicon-containing film by the etching, and
    electrically biasing the substrate to remove the silicon-containing film in which a part of silicon atoms are substituted with tungsten atoms,
    wherein, in the electrically biasing the substrate, a negative DC voltage having a duty ratio of 5% or more and 40% or less, is periodically applied to the substrate support in a state where a bias frequency, which is a reciprocal of a time interval in which the negative DC voltage is applied to the substrate support, is set to 100 kHz or more and 1 MHz or less.

16. The etching method according to claim 15, wherein a pressure in the chamber in (c) is set to less than 1.333 Pa.

17. The etching method according to claim 15, wherein a ratio of a flow rate of the tungsten hexafluoride gas in the processing gas to a flow rate of the processing gas is 5% by volume or less.

18. The etching method according to claim 15, wherein the processing gas further contains nitrogen trifluoride gas.

19. The etching method according to claim 18, wherein a ratio of a flow rate of the nitrogen trifluoride gas in the processing gas to a flow rate of the processing gas is larger than a ratio of a flow rate of the tungsten hexafluoride gas in the processing gas to the flow rate of the processing gas.

20. The etching method according to claim 15, wherein the processing gas contains a fluorocarbon gas as the gas containing carbon and fluorine.

21. The etching method according to claim 20, wherein the silicon-containing film further includes a silicon nitride film.

22. The etching method according to claim 20, wherein the silicon-containing film further includes a polycrystalline silicon film.

23. The etching method according to claim 15, wherein the silicon-containing film further includes a silicon nitride film, and the processing gas contains a hydrofluorocarbon gas as the gas containing carbon and fluorine.

24. The etching method according to claim 23, wherein, in (c), a tungsten-containing film is formed on a side wall formed on the silicon nitride film by the etching.

25. The etching method according to claim 15, wherein the silicon-containing film includes a stacked film including the silicon oxide film and the silicon nitride film, and step (c) includes:

etching the silicon nitride film in a state where the bias frequency is set to a first frequency the bias frequency being a reciprocal of a time interval in which the negative DC voltage is applied to the substrate support, and etching the silicon oxide film in a state where the bias frequency is set to a second frequency larger than the first frequency.

26. The etching method according to claim 15, wherein, in step (c), a temperature of the substrate support is set to 0° C. or higher and 120° C. or lower.

27. The etching method according to claim 15, wherein, in step (c), an absolute value of the negative DC voltage applied to the substrate support is 1 kV or more and 20 kV or less.

28. The etching method according to claim 15, wherein the substrate further includes an underlying region or an etching stop layer, and the etching method further includes (d) stopping the supply of the tungsten hexafluoride gas in the processing gas during a period including a time when the underlying region or the etching stop layer is exposed, and (e) etching the silicon-containing film with plasma generated from a gas other than the tungsten hexafluoride gas contained in the processing gas.

* * * * *